US012751021B2

(12) United States Patent
Jain et al.

(10) Patent No.: US 12,751,021 B2
(45) Date of Patent: Sep. 29, 2026

(54) FERROMAGNETIC MATERIAL BASED INTEGRATED INDUCTOR IN SILICON

(71) Applicant: NVIDIA Corp., Santa Clara, CA (US)

(72) Inventors: Padam Jain, Santa Jose, CA (US); Shantanu Kalchuri, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 425 days.

(21) Appl. No.: 18/313,535

(22) Filed: May 8, 2023

(65) Prior Publication Data

US 2024/0379731 A1 Nov. 14, 2024

(51) Int. Cl.

| | |
|---|---|
| ***H10D 1/20*** | (2025.01) |
| ***H01F 27/28*** | (2006.01) |
| ***H01F 41/02*** | (2006.01) |
| ***H10W 70/63*** | (2026.01) |

(52) U.S. Cl.

CPC ........... *H10D 1/20* (2025.01); *H01F 27/2823* (2013.01); *H01F 41/02* (2013.01); *H10W 70/635* (2026.01)

(58) Field of Classification Search

CPC ........... H01L 23/49827; H01F 27/2823; H01F 41/02; H10D 1/20

See application file for complete search history.

(56) References Cited

U.S. PATENT DOCUMENTS

| | | | | |
|---|---|---|---|---|
| 2002/0097132 | A1* | 7/2002 | Ahn | H10D 84/00 336/200 |
| 2005/0093669 | A1* | 5/2005 | Ahn | H01F 5/003 336/200 |
| 2009/0188104 | A1* | 7/2009 | Ching | H01F 41/046 29/602.1 |
| 2013/0285256 | A1* | 10/2013 | Fischer | H10W 20/057 257/774 |
| 2015/0348695 | A1* | 12/2015 | Kostelnik | H01F 41/046 336/200 |
| 2021/0065959 | A1* | 3/2021 | Sturcken | H01F 27/24 |

* cited by examiner

*Primary Examiner* — Vongsavanh Sengdara
(74) *Attorney, Agent, or Firm* — Carnelian Law, LLC

(57) ABSTRACT

A process for manufacturing inductors for use in integrated circuits includes embedding ferromagnetic material in a bulk silicon substrate, forming a plurality of vias in the bulk silicon substrate such that the vias bracket a volume of the bulk silicon substrate that includes the ferromagnetic material, slicing the bulk silicon substrate to form a silicon wafer, and configuring traces between top metal pads of the vias and between bottom metal pads of the vias to form a continuous path for current to flow circumferentially from a first end of the volume to a second end of the volume.

16 Claims, 4 Drawing Sheets

FERROMAGNETIC MATERIAL BASED INTEGRATED INDUCTOR IN SILICON

BACKGROUND

Switched-inductor integrated voltage regulators (IVRs) are utilized to reduce the current generated in devices utilizing integrated circuits. Other applications of IVRs are to improve regulator droop response (lower over/undershoot control) and to provide dynamic voltage and frequency scaling.

IVRs utilize inductors that switch at high frequencies that may be integrated on-die with the power-consuming devices, or as close as possible to them (inside the substrate). Conventional substrate- or silicon-based air core inductor designs have been developed and deployed in the industry. However, they suffer from limitation on inductance values. There are also ferromagnetic-based thin film inductor solutions integrated in active silicon, but these are typically fabricated in the backend layers of silicon, which introduces constraints and challenges to the materials and process conditions that may be utilized.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Manufacturing processes are described for the fabrication of ferromagnetic core inductors in silicon. Ferromagnetic material is deposited into a bulk silicon substrate at early stages of the integrated circuit manufacturing process. Follow-on process stages (e.g., interposer processing) completes the fabrication of the inductor structures and circuitry utilizing the inductors.

Integrated circuit components utilize structures known as interposers to provide electrical connections between dies and components within a more extensive circuit package comprising the components. Interposer structures provide a substrate for connecting multiple components to form a single package.

Interposers provide utilities for package design, such as providing mounting surface for semiconductor dies the package, enabling connections between semiconductor dies, and enabling the connection of mounted components to a packaging substrate.

Interposers comprise a set of vias (i.e., through-silicon vias) and metal pads used to make connections to semiconductor dies within the package. The interposer connects to a package substrate, which facilitates further routing between components and to the exterior of the package. The bottom side of the substrate may comprise an array of solder balls (e.g., a ball grid array footprint).

Passive interposers provide electrical connections between dies on the top side of the interposer. Aside from conductive tracks, passive interposers do not comprise any electronic circuitry. They provide a structural support with conductive paths for signals. Because silicon is a semiconductor, it may be utilized to build active interposers, which comprise devices embedded in the silicon structure.

The interposer may couple to the package substrate through its metal ball connections, and the substrate may carry these connections between dies arranged on the interposer. The connections eventually reach the bottom surface where they couple to the ball grid array.

The ferromagnetic material is deposited into a bulk silicon substrate blank. The ferromagnetic material does not interact or interfere with materials other than the bulk silicon, expanding the practical types of ferromagnetic materials and deposition methods that may be utilized in the process (plating, physical vapor deposition, sintering etc.).

Relatively large diameter coils (as compared to what is practical with conventional approaches) may be fabricated because the inductor coil diameters are limited only by the processing limitations of the vertical interconnect aspect ratio in silicon. Different types of ferromagnetic materials may be deposited in different locations on the bulk silicon substrate to fine-tune inductor properties in different areas of a large circuit structure. The required thickness of silicon wafers sliced from the bulk silicon substrate is not impacted and the processes are compatible with conventional silicon interposer process flows.

Figure 1:
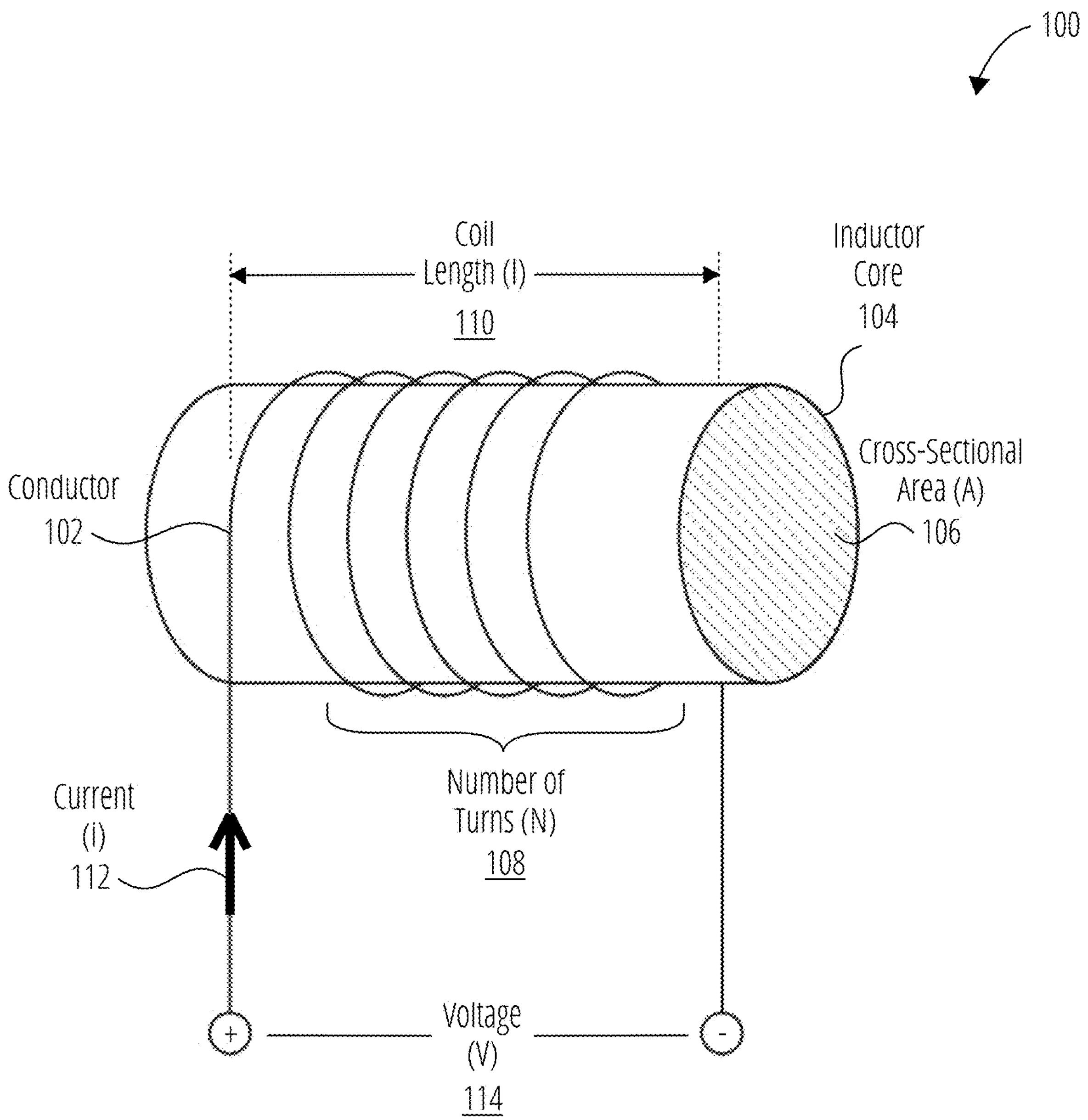
FIG. 1 depicts an idealized inductor structure 100.

FIG. 1 depicts an idealized inductor structure 100. The idealized inductor structure 100 comprises a conductor 102 wrapped around an inductor core 104, where the conductor 102 is a conductor of electricity such as a metal wire or ribbon and the inductor core 104 comprises semiconductor substrate material comprising material properties sufficient to generate a desired magnetic response to current flowing through the conductor 102. The conductor 102 may be coated with insulative material preventing the conductor 102 from shorting to itself or to the inductor core 104.

The inductor core 104 may have a cross-sectional area 106 "A" around which the conductor 102 is wrapped in a number of turns 108 "N", forming a coil having coil length 110 "l". A current 112 "i" flowing through the conductor. 102 of the inductor coil may induce a time-dependent voltage 114 "V" response across the ends of the conductor 102. This voltage 114 may be expressed as:

$$V(t) = L_{coil} \times \frac{di}{dt}$$

where V(t) is the voltage in volts at time t, $L_{coil}$ is the inductance of the coil in Henries (H), and di/dt is the rate of change of the current in time.

Inductance $L_{coil}$ is proportional to the cross-sectional area of the inductor coil. The inductance of an inductor structure may be approximately determined from the following classical equation:

$$L_{coil} = \frac{\mu_r \mu_0 N^2 A}{l}$$

where:

$L_{coil}$=inductance of the coil in Henries (H)

$\mu_r$=relative permeability of the inductor core material (dimensionless)

$\mu_0$=permeability of free space=$4\pi \times 10^{-7}$ (H/m)

N=Number of turns

A=coil cross-sectional area ($m^2$)

l=coil length

For a cylindrical inductor, the coil cross-sectional area A=$\pi r^2$ where r is the radius of the coil in meters (m).

Figure 2A:
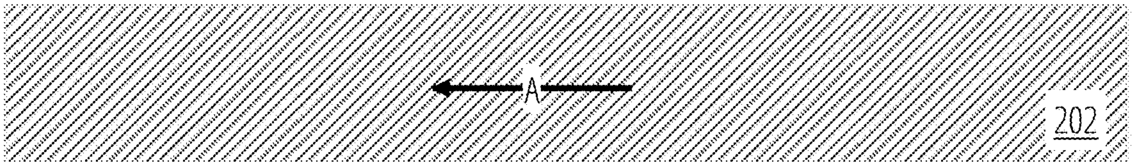
FIG. 2A is a side-view cutaway depiction of a bulk silicon substrate.
Figure 2B:
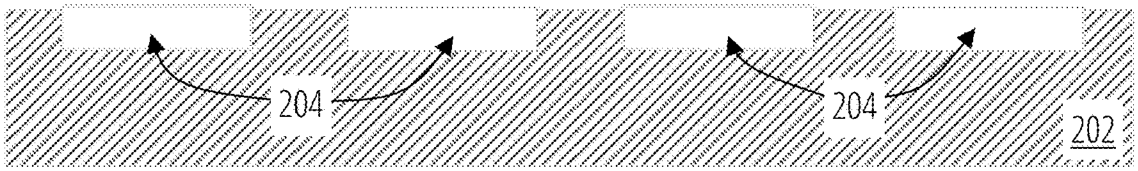
FIG. 2B is a side-view cutaway depiction of cavities formed in a bulk silicon substrate, in accordance with one embodiment.

FIG. 2A is a side-view cutaway depiction of a bulk silicon substrate 202, and FIG. 2B is a side-view cutaway depiction of cavities 204 formed in the bulk silicon substrate 202. In the depicted embodiment the cavities 204 are rectangular and universally spaced, however more generally the shape, depth, spacing, and dimensions of the cavities 204 may be varied in order to produce different inductance effects. "Bulk silicon substrate" refers to a volume of silicon that has not yet been sliced into multiple silicon wafers.

The sequence of cavities 204 need not have a regular pattern, e.g., the spacing between them, and/or their dimensions, may vary across the silicon substrate 202. The cavities 204 are etched into the silicon substrate 202 with a depth less than the interposer thickness in areas of the silicon substrate 202 designated in a circuit layout to implement inductor cores. In one embodiment one continuous cavity may be formed instead of multiple cavities with spacing of silicon substrate 202 material between them.

Figure 2C:
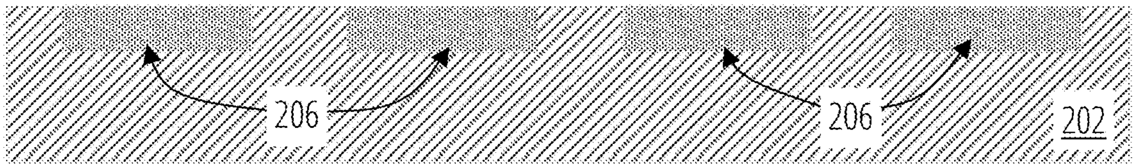
FIG. 2C is a side-view cutaway depiction of ferromagnetic material deposited in the cavities formed in a bulk silicon substrate, in accordance with one embodiment.

FIG. 2C is a side-view cutaway depiction of ferromagnetic material 206 deposited in the cavities 204 in accordance with one embodiment. Ferromagnetic material 206 such as a nickel-iron compound may be deposited or plated to fill the cavities 204 to a level coplanar with the surface of the bulk silicon substrate 202.

Because the process up to this step is carried out on a bulk silicon substrate 202 lacking any finer circuit structures, the ferromagnetic material 206 may be deposited using high-temperature sintering. Examples of ferromagnetic material 206 that may be utilized and the associated relative permeability are provided in the following table.

| Ferromagnetic material | Relative Permeability |
|---|---|
| Ni | 100-600 |
| Ni—Zn | 16-640 |
| CoFeHfO | 150 |
| CoTaZr | 600 |

Figure 2D:
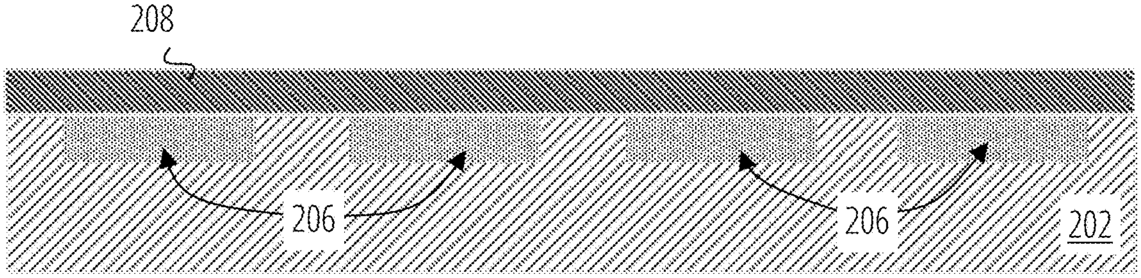
FIG. 2D is a side-view cutaway depiction of an insulating material layer deposited over ferromagnetic material deposited in the cavities formed in a bulk silicon substrate, in accordance with one embodiment.

As depicted in FIG. 2D, a layer of insulating material 208 is then deposited over the ferromagnetic material 206 and surface of the silicon substrate 202. In one embodiment the insulating material 208 may then be etched away from areas of the silicon substrate 202 that do not have ferromagnetic material 206, or the insulating material 208 may be deposited only over areas comprising ferromagnetic material 206. This step may involve CMP and deposition of polysilicon or oxide-nitride material to insulate the ferromagnetic material 206 for interposer processing. "Interposer processing" refers to the process steps utilized to form the interposer structure of an integrated circuit package.

During interposer processing of a wafer derived from the bulk silicon substrate 202, the insulating material 208 is utilized both for patterning metal traces and circuits around the ferromagnetic material 206, and also for forming the inductor structure using the ferromagnetic material 206.

Figure 2E:
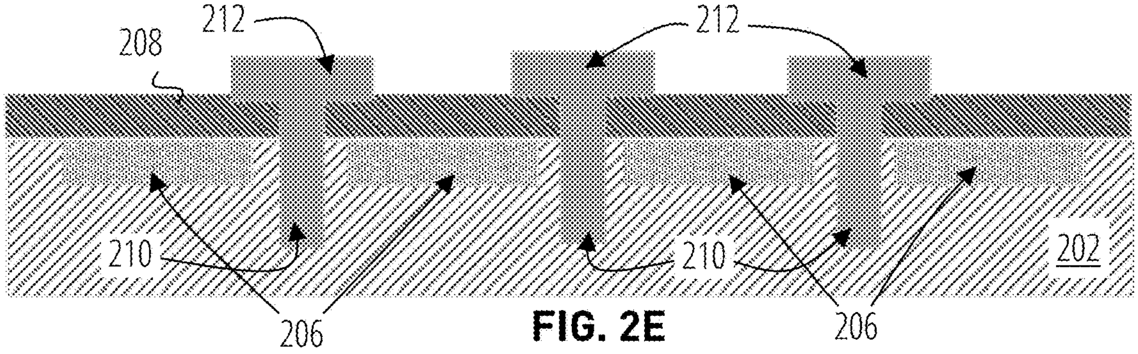
FIG. 2E is a side-view cutaway depiction of vias and metal pads added to the structure of FIG. 2D, in accordance with one embodiment.
Figure 2F:
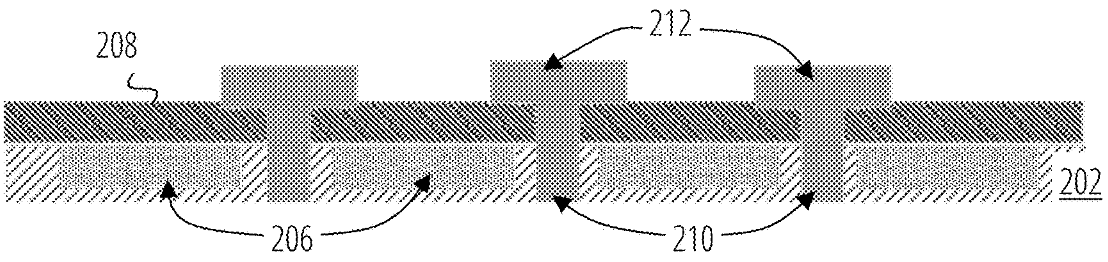
FIG. 2F is a side-view cutaway depiction of the structure of FIG. 2E after silicon substrate/wafer thinning to reveal through-silicon vias, in accordance with one embodiment.

FIG. 2E is a side-view cutaway depiction of vias 210 and top-surface metal pads 212 added to the structure of FIG. 2D during interposer processing, in accordance with one embodiment. The vias 210 are formed to a depth at or somewhat exceeding a lowest depth of the ferromagnetic materials 206 in the silicon substrate 202. As depicted in FIG. 2F, the bulk silicon substrate 202 may then be subjected to thinning to reveal through-silicon vias. Interposer processing may then continue as depicted in FIG. 2G.

Figure 2G:
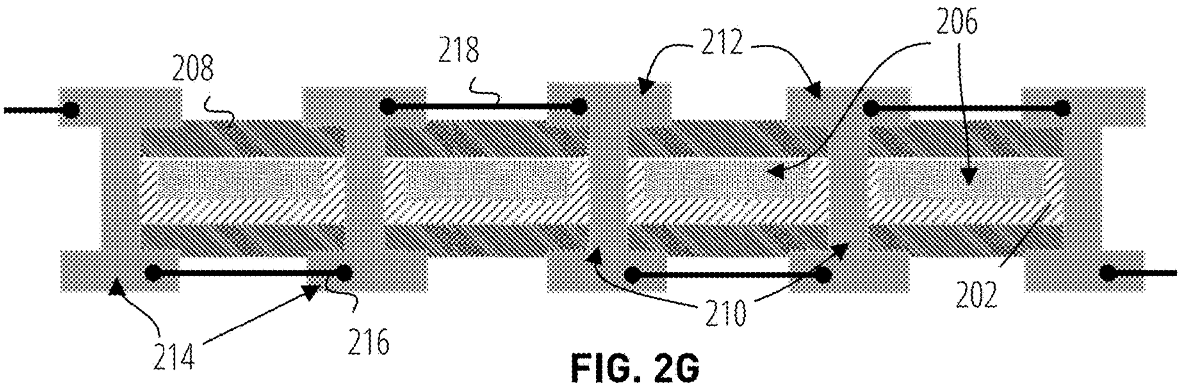
FIG. 2G is a side-view cutaway depiction of the structure of FIG. 2F with bottom-surface metal pads and top- and bottom-surface traces added, in accordance with one embodiment.
Figure 3:
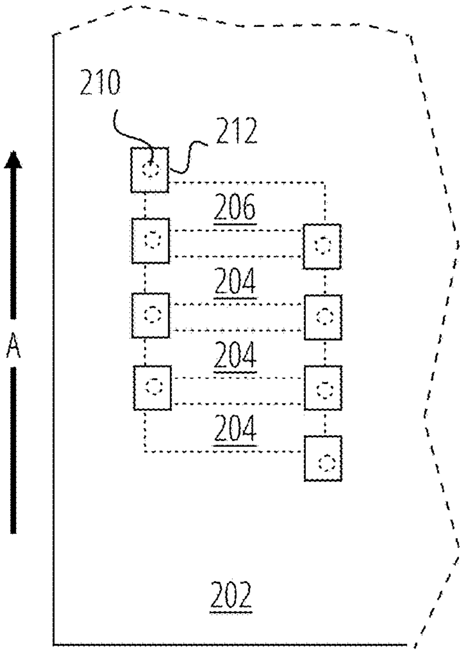
FIG. 3 is a top-side depiction of the structure of FIG. 2G, in accordance with one embodiment.

FIG. 2G is a side-view cutaway depiction of the structure of FIG. 2F with bottom-surface metal pads 214, bottom-surface traces 216, and top-surface traces 218 added during interposer processing, in accordance with one embodiment. An integrated via-based inductor structure has been formed in the silicon wafer and this may now be integrated into a larger integrated circuit structure with additional patterning and tracing. FIG. 3 is a top-side depiction of such an integrated inductor structure in accordance with one embodiment.

Processes for forming integrated inductor structures in silicon wafers may therefore involve embedding either a plurality of discrete volumes of ferromagnetic material or a continuous volume of ferromagnetic material in a bulk silicon substrate, forming a plurality of vias in the bulk silicon substrate such that the vias bracket a volume of the bulk silicon substrate that includes the ferromagnetic material, slicing the bulk silicon substrate to form a silicon wafer, and configuring traces between top metal pads of the vias and between bottom metal pads of the vias to form a continuous path for current to flow circumferentially from a first end of the volume to a second end of the volume.

As depicted for example in FIG. 3, the volumes of embedded ferromagnetic material may have a regular shape and the vias may be formed into two parallel rows, thus enclosing a rectangular volume of inductor core materials. More generally, the embedded volumes of ferromagnetic material may vary in shape, for example they may taper off in width along the inductor structure, and the via rows may likewise taper, forming an enclosed prism volume for the inductor core.

Figure 4:
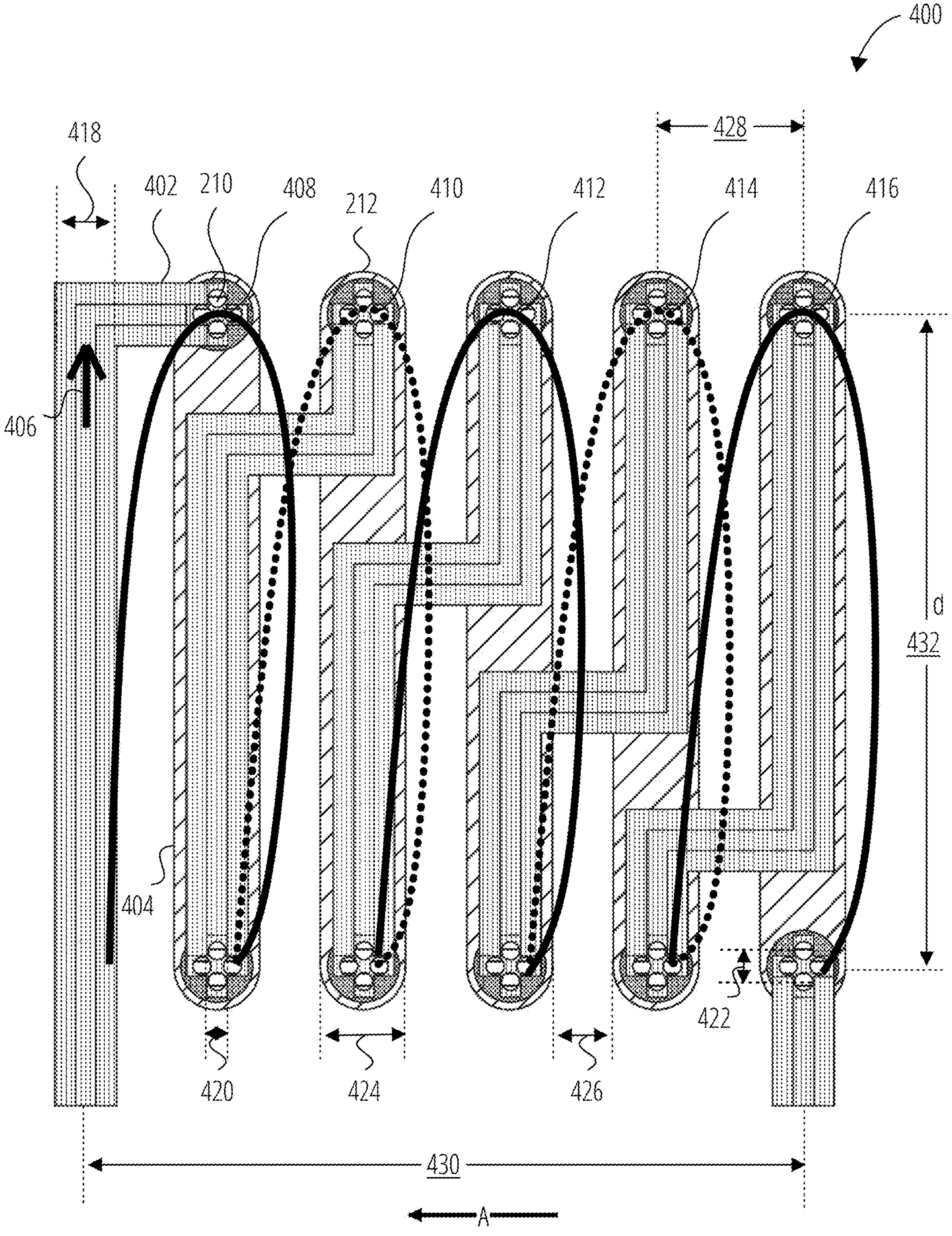
FIG. 4 depicts a plan view of a five-turn via-based integrated inductor structure 400 in accordance with one embodiment.

The vias and embedded ferromagnetic material volumes may have a regular spacing, but in general this need not be the case. As depicted in the example of FIG. 4, in some embodiments the metal pads of the vias may be connected with traces that comprise only right-angle turns, and the vias may grouped into via clusters (e.g., of two or four vias each). Other technical features may be readily apparent to one skilled in the art from the following figures, descriptions, and claims.

FIG. 4 depicts a plan view five-turn via-based integrated inductor structure 400 in accordance with one embodiment. The top-side traces 402 are triple-stacked together and electrically coupled to vias 210 in a quad configuration, wherein four vias 210 are utilized for each cross-layer connection. This configuration may achieve low parasitic resistance and sufficient inductance within the constraints of the fabrication processes utilized for advanced process nodes. This embodiment should not be understood to limit the scope of the disclosed mechanisms to a particular trace stack depth or via grouping number.

The quad-arranged vias 210 may pass through the silicon substrate 202 to connect the top-side traces 402 to metal pads 214 on a different layer. The metal pads 214 may be connected by back-side traces 404. In this manner, current 406 may travel through turn 1 408, turn 2 410, turn 3 412, turn 4 414, and turn 5 416 of the five-turn via-based integrated inductor structure 400, as indicated.

In one embodiment, back side metal structures may be connected through traces in the underlying substrate, in order to reduce disruption of the interposer process flow.

By way of example, the triple top-side trace width 418 may be 40 μm. Each via 210 of the quad via arrangements may have a via diameter 420 of 12 μm. The vias 210 may be arranged in quad via configurations with a via pitch 422 of 20 μm. The back-side traces 404 and metal pads 214 may have a back-side pad and trace width 424 of 57 μm. The back-side traces 404 may have a back-side pad and trace spacing 426 of 10 μm (note that this is not depicted to scale). The quad vias along each side of the coil may have a quad via pitch 428 of 67 μm.

In such an embodiment, the coil length 430 1 would be 335 μm. The coil depth 432 *d* may be 536 μm. Where the vias 210 have the height of 50 μm, the coil height h would be 50 μm, and the cross sectional area A would be d×h. With the conductors arranged as a five-turn via-based integrated inductor structure 400, N would be 5, the ferromagnetic materials 206 form one part of the inductor core 104 (another part of the inductor core 104 may be silicon of the silicon substrate 202 with a $\mu_r$=0.99837). The five-turn via-based integrated inductor structure 400 configured thus would achieve a substantial inductance within an area of less than 0.2 $mm^2$.

LISTING OF DRAWING ELEMENTS

100 idealized inductor structure
102 conductor
104 inductor core
106 cross-sectional area
108 number of turns
110 coil length
112 current
114 voltage
202 silicon substrate
204 cavity
206 ferromagnetic material
208 insulating material
210 via
212 metal pad
214 metal pad
216 bottom-surface trace
218 top-surface trace
400 five-turn via-based integrated inductor structure
402 top-side trace
404 back-side trace
406 current
408 turn 1
410 turn 2
412 turn 3
414 turn 4
416 turn 5
418 top-side trace width
420 via diameter
422 via pitch
424 back-side pad and trace width
426 back-side pad and trace spacing
428 quad via pitch
430 coil length
432 coil depth Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation-[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112 (f) for that claim element. Accordingly, claims in this application that do not otherwise include the "means for" [performing a function] construct should not be interpreted under 35 U.S.C § 112 (f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A method comprising:

embedding ferromagnetic material in a bulk silicon substrate;

forming a plurality of vias in the bulk silicon substrate such that the vias bracket a volume of the bulk silicon substrate comprising the ferromagnetic material;

slicing the bulk silicon substrate to form a silicon wafer; and configuring traces between top metal pads of the vias and between bottom metal pads of the vias to form a continuous path for current to flow circumferentially from a first end of the volume to a second end of the volume.

2. The method of claim 1, wherein the vias are formed into two parallel rows.

3. The method of claim 1, wherein the volume of core material is a prism.

4. The method of claim 1, wherein the volume of core material is a rectangular volume.

5. The method of claim 1, wherein the vias have a regular spacing.

6. The method of claim 1, wherein the traces comprise only right-angle turns.

7. The method of claim 1, wherein the vias are grouped into via clusters.

8. The method of claim 7, wherein the via clusters consist of pairs of vias.

9. The method of claim 7, wherein the via clusters consist of quads of vias.

10. An integrated circuit fabrication method comprising:

forming a plurality of ferromagnetic material embeddings in a bulk silicon substrate;

forming two rows of vias bracketing a volume of the bulk silicon substrate comprising the ferromagnetic material embeddings;

configuring traces between top metal pads of the vias and between bottom metal pads of the vias to form a circumferential end-to-end winding around the volume of the bulk silicon substrate; and slicing the bulk silicon substrate at a thickness greater than a lowest depth of the ferromagnetic material embeddings in the bulk silicon substrate to form a silicon wafer comprising a top surface and a bottom surface.

11. The method of claim 10, wherein the vias are evenly spaced in parallel rows.

12. The method of claim 10 wherein the volume is rectangular.

13. The method of claim 10, further comprising:

depositing an insulating material layer over the ferromagnetic material embeddings.

14. The method of claim 10, further comprising:

forming metal pads for the vias on the top surface and bottom surface of the silicon wafer.

15. The method of claim 14, further comprising:

configuring traces between the metal pads on the top surface and between the metal pads on the bottom surface to form a continuous path for current to flow circumferentially from a first end of the volume to a second end of the volume.

16. An integrated circuit fabrication method comprising:

forming a plurality of ferromagnetic material embeddings in a bulk silicon substrate;

forming two rows of vias bracketing a volume of the bulk silicon substrate comprising the ferromagnetic material embeddings;

depositing an insulating material layer over the ferromagnetic material embeddings; and slicing the bulk silicon substrate at a thickness greater than a lowest depth of the ferromagnetic material embeddings in the bulk silicon substrate to form a silicon wafer comprising a top surface and a bottom surface.

* * * * *